(12) United States Patent
Sternberg et al.

(10) Patent No.: US 7,032,160 B2
(45) Date of Patent: Apr. 18, 2006

(54) COMMUNICATION SYSTEM AND METHOD USING SIGNAL TO NOISE RATIO ESTIMATION FOR SCALING IN PROCESSING RECEIVED WIRELESS COMMUNICATION SIGNALS

(75) Inventors: Gregory S. Sternberg, Great Neck, NY (US); Rui Yang, Greenlawn, NY (US); Philip J. Pietraski, Huntington Station, NY (US); Robert Lind Olesen, Huntington, NY (US)

(73) Assignee: InterDigital Technology Corporation, Wilmington, DE (US)

( * ) Notice: Subject to any disclaimer, the term of this patent is extended or adjusted under 35 U.S.C. 154(b) by 0 days.

(21) Appl. No.: 10/912,671

(22) Filed: Aug. 5, 2004

(65) Prior Publication Data

US 2005/0008103 A1    Jan. 13, 2005

Related U.S. Application Data (63) Continuation of application No. 10/715,153, filed on Nov. 17, 2003, now Pat. No. 6,931,584.

(60) Provisional application No. 60/427,849, filed on Nov. 20, 2002.

(51) Int. Cl.
*H03M 13/00* (2006.01)
(52) U.S. Cl. ...................... 714/780; 714/774
(58) Field of Classification Search ............... 714/704, 714/774, 780
See application file for complete search history.

(56) References Cited

U.S. PATENT DOCUMENTS

| | | | |
|---|---|---|---|
| 5,509,020 A | 4/1996 | Iwakiri et al. | |
| 5,815,115 A * | 9/1998 | Carloni et al. | ............... 342/359 |
| 5,872,775 A | 2/1999 | Saints et al. | |
| 6,292,920 B1 | 9/2001 | Nakano | |
| 6,337,913 B1 * | 1/2002 | Chang | ........................ 381/14 |
| 6,359,934 B1 | 3/2002 | Yoshida | |
| 6,389,067 B1 | 5/2002 | Riddle et al. | |
| 6,414,948 B1 | 7/2002 | Sato | |
| 6,542,558 B1 | 4/2003 | Schulist et al. | |
| 6,560,744 B1 | 5/2003 | Burshtein | |
| 6,615,386 B1 | 9/2003 | Yano et al. | |

\* cited by examiner

*Primary Examiner*—Guy Lamarre
*Assistant Examiner*—Fritz Alphonse
(74) *Attorney, Agent, or Firm*—Volpe and Koenig, P.C.

(57) ABSTRACT

A system, components and methods provide FEC decoding in a wireless communication system in which signal to noise ratio estimation is used for scaling information captured by a demodulator in processing received wireless communication signals. A preferred wireless transmit receive unit (WTRU) has a channel rate estimation device configured to process the received communication signals for the particular communication channel and to produce channel change rate estimates. A signal to noise ratio (SNR) estimation device of the WTRU is configured to produce SNR estimates based on observation windows of a calculated number of samples of the received signal where the number of samples used for each observation window is calculated a function of the channel change rate estimates produce by the channel rate estimation device.

20 Claims, 5 Drawing Sheets

COMMUNICATION SYSTEM AND METHOD USING SIGNAL TO NOISE RATIO ESTIMATION FOR SCALING IN PROCESSING RECEIVED WIRELESS COMMUNICATION SIGNALS

CROSS-REFERENCE TO RELATED APPLICATIONS

This application is a continuation of U.S. patent application Ser. No. 10/715,153, filed Nov. 17, 2003 now U.S. Pat. No. 6,931,584, which claims the benefit of U.S. Provisional Patent Application No. 60/427,849, filed Nov. 20, 2002, which are incorporated herein by reference.

FIELD OF THE INVENTION

The present invention relates to methods and apparatus for wireless communications systems, and in particular to systems that utilize signal to noise ratio estimation for scaling information captured by a demodulator in processing received wireless communication signals.

BACKGROUND

Wireless telecommunication systems are well known in the art. In order to provide global connectivity for wireless systems, standards have been developed and are being implemented. One current standard in widespread use is known as Global System for Mobile Telecommunications (GSM). This is considered as a so-called Second Generation mobile radio system standard (2G) and was followed by its revision (2.5G). GPRS and EDGE are examples of 2.5G technologies that offer relatively high speed data service on top of (2G) GSM networks. Each one of these standards sought to improve upon the prior standard with additional features and enhancements. In January 1998, the European Telecommunications Standard Institute—Special Mobile Group (ETSI SMG) agreed on a radio access scheme for Third Generation Radio Systems called Universal Mobile Telecommunications Systems (UMTS). To further implement the UMTS standard, the Third Generation Partnership Project (3GPP) was formed in December 1998. 3GPP continues to work on a common third generational mobile radio standard.

Figure 1:
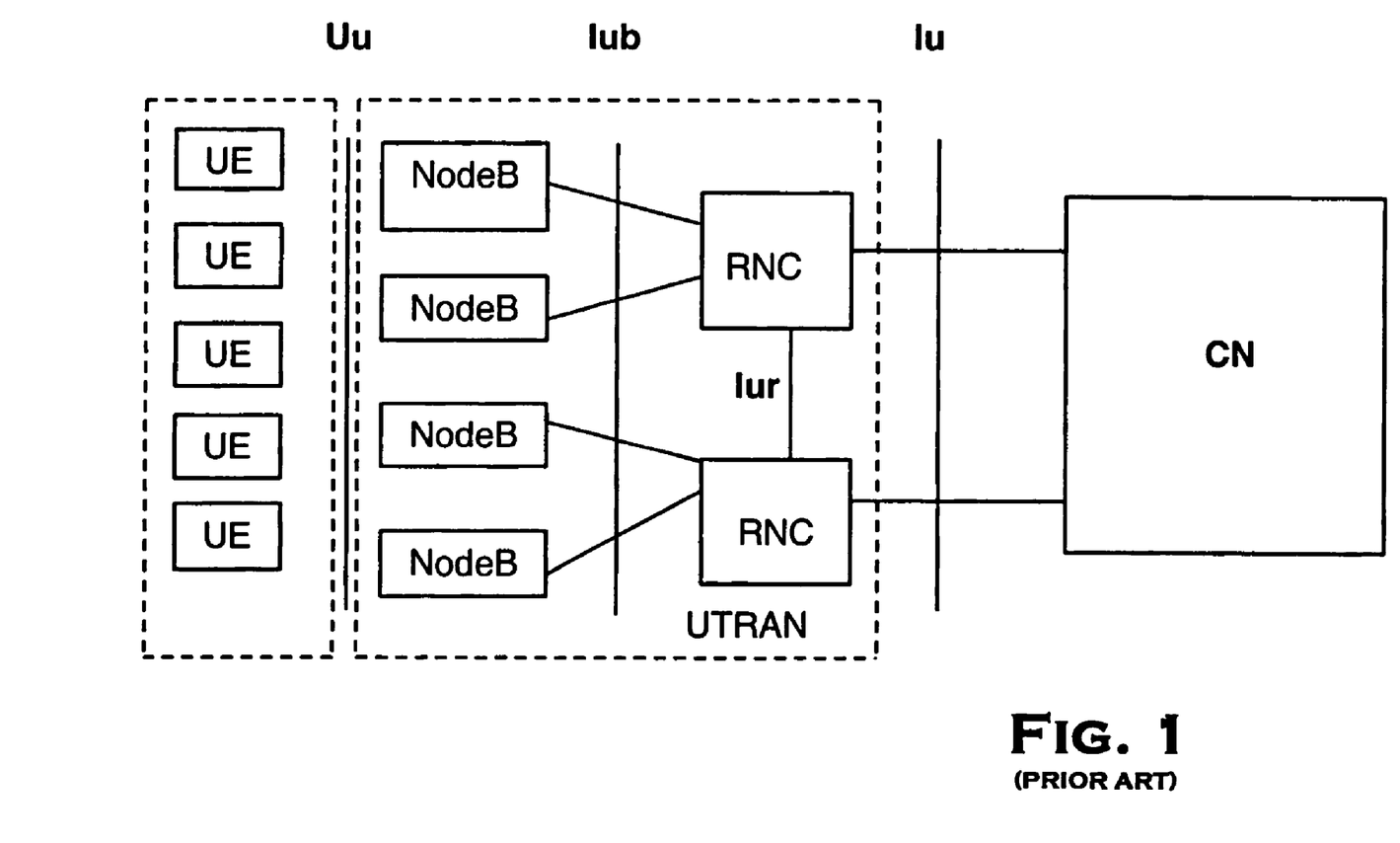
FIG. 1 shows an overview of a system architecture of a conventional UMTS network.

A typical UMTS system architecture in accordance with current 3GPP specifications is depicted in FIG. 1. The UMTS network architecture includes a Core Network (CN) interconnected with a UMTS Terrestrial Radio Access Network (UTRAN) via an interface known as Iu which is defined in detail in the current publicly available 3GPP specification documents. The UTRAN is configured to provide wireless telecommunication services to users through wireless transmit receive units (WTRUs), known as User Equipments (UEs) in 3GPP, via a radio interface known as Uu. The UTRAN has one or more Radio Network Controllers (RNCs) and base stations, known as Node Bs in 3GPP, which collectively provide for the geographic coverage for wireless communications with UEs. One or more Node Bs are connected to each RNC via an interface known as Iub in 3GPP. The UTRAN may have several groups of Node Bs connected to different RNCs; two are shown in the example depicted in FIG. 1. Where more than one RNC is provided in a UTRAN, inter-RNC communication is performed via an Iur interface.

Communications external to the network components are performed by the Node Bs on a user level via the Uu interface and the CN on a network level via various CN connections to external systems.

In general, the primary function of base stations, such as Node Bs, is to provide a radio connection between the base stations' network and the WTRUs. Typically a base station emits common channel signals allowing non-connected WTRUs to become synchronized with the base station's timing. In 3GPP, a Node B performs the physical radio connection with the UEs. The Node B receives signals over the Iub interface from the RNC that control the radio signals transmitted by the Node B over the Uu interface.

A CN is responsible for routing information to its correct destination. For example, the CN may route voice traffic from a UE that is received by the UMTS via one of the Node Bs to a public switched telephone network (PSTN) or packet data destined for the Internet. In 3GPP, the CN has six major components: 1) a serving General Packet Radio Service (GPRS) support node; 2) a gateway GPRS support node; 3) a border gateway; 4) a visitor location register; 5) a mobile services switching center; and 6) a gateway mobile services switching center. The serving GPRS support node provides access to packet switched domains, such as the Internet. The gateway GPRS support node is a gateway node for connections to other networks. All data traffic going to other operator's networks or the internet goes through the gateway GPRS support node. The border gateway acts as a firewall to prevent attacks by intruders outside the network on subscribers within the network realm. The visitor location register is a current serving networks 'copy' of subscriber data needed to provide services. This information initially comes from a database which administers mobile subscribers. The mobile services switching center is in charge of 'circuit switched' connections from UMTS terminals to the network. The gateway mobile services switching center implements routing functions required based on current location of subscribers. The gateway mobile services also receives and administers connection requests from subscribers from external networks.

The RNCs generally control internal functions of the UTRAN. The RNCs also provides intermediary services for communications having a local component via a Uu interface connection with a Node B and an external service component via a connection between the CN and an external system, for example overseas calls made from a cell phone in a domestic UMTS.

Typically a RNC oversees multiple base stations, manages radio resources within the geographic area of wireless radio service coverage serviced by the Node Bs and controls the physical radio resources for the Uu interface. In 3GPP, the Iu interface of an RNC provides two connections to the CN: one to a packet switched domain and the other to a circuit switched domain. Other important functions of the RNCs include confidentiality and integrity protection.

Such conventional communications systems can be configured to utilize Forward Error Correction (FEC) in connection with wireless communications. Generally, information captured by a demodulator regarding a transmitted bit sequence is selectively scaled before being passed to a FEC decoder. Conventionally, scaling takes into account the level of noise that has been added by a channel. Accordingly, accurate signal to noise ratio (SNR) estimation is required for optimal performance. Additionally, when the SNR for a channel varies over time, multiple estimates of SNR can be required throughout a given code block.

Conventionally, the scaling of soft information is performed in a uniform manner based on a fixed length observation period across an entire code block. The inventors have recognized a problem in the use of a fixed length observation period or window in generating the SNR estimates. With relatively short observation for SNR estimation, proper scaling of soft information prior to FEC decoding is achieved at a rate that is sufficient for the time varying nature of a channel or the time varying nature of the transmitted signal, but the estimates of SNR are degraded due to the relatively small sample from which the estimate was computed. With relatively long observation for SNR estimation, the SNR estimates more accurately reflect the average SNR over the duration of the observation, but the soft information may not be properly scaled for most of the code block, particularly if there is substantial variation of the SNR over the code block period.

The inventors' recognition of this problem is in accord with their observation that for channels with rapid fluctuations in signal level, decoded bit error probability, block error probability, and consequently, throughput performance are significantly degraded. Accordingly, it is desirable to provide for soft information scaling in a manner which can balance the benefits and detriments of long observation and short observation for SNR estimation based on the actual context of the particular wireless communications.

SUMMARY

The invention provides methods and apparatus for wireless communications systems that utilize signal to noise ratio estimation for scaling information captured by a demodulator in processing received wireless communication signals.

A wireless transmit receive unit (WTRU) is configured for implementing forward error detection decoding (FEC) of received communication signals and has a demodulator configured to process received modulated communication signals for a particular communication channel and to produce demodulated signals. The preferred WTRU has a channel rate estimation device configured to process the received communication signals for the particular communication channel and to produce channel rate change estimates. A signal to noise ratio (SNR) estimation device of the WTRU is configured to produce SNR estimates based on observation windows of a calculated number of samples of the received signal where the number of samples used for each observation window is calculated as a function of the channel rate change estimates produced by the channel rate estimation device. As with prior art WTRUs, a combiner device is configured to produce adjusted demodulated signals based on the demodulated signals produced by the demodulator and the SNR estimates produced by the SNR estimation device and an FEC decoder is configured for decoding the adjusted demodulated signals and outputting decoded information bits.

Preferably, the WTRU includes an observation window selection device configured to compute desired observation periods based on the channel change rate estimates produced by the channel rate estimation device and to output the computed desired observation periods to the SNR estimator device to control the number of samples used for the observation windows upon which the respective SNR estimates are based. The channel change rate estimation device is preferably configured to produce the channel change rate estimates R as follows:

$$R = \frac{1}{2\pi\Delta t} \underset{\substack{k \\ |h[k,t]| \neq 0 \\ |h[k,t+\Delta t]| \neq 0}}{\text{Max}} \arg\left(\frac{h[k,t]}{h[k,t-\Delta t]}\right)$$

where h[k,t] is the estimated channel impulse response at lag k, and time t. R can alternatively be computed by other means that are, e.g., less complex. Additional factors may also be considered in the selection of the window size such as the SNR estimates themselves since actual SNR also impacts the quality of the SNR estimates. Furthermore, the window shape (i.e., weighting of the importance of different samples) may also be altered to provide performance improvements, e.g., an equally weighted moving average window may be replaced with and exponentially weighted moving average if indicated.

The WTRU can, for example, be configured for use in a Universal Mobile Telecommunications System (UMTS) as a user equipment (UE) or a base station. Where the WTRU is configured for use in a communication system where the channel data is interleaved prior to transmission, a de-interleaver, configured to perform an inverse of the interleaving process performed prior to transmission, is preferably situated after the combiner device and in advance of the FEC decoder. Where the WTRU is configured for use in a communication system that employs Hybrid Automatic Repeat Requests (H-ARQ), a retransmission combining device and a cyclic redundancy code (CRC) checking device are preferably provided. The CRC device is preferably configured to receive the output decoded information bits of the FEC decoder, conduct a cyclic redundancy check and to output the CRC checking results for use as an acknowledgement and for use by the retransmission combining device. The retransmission combining device is preferably situated between the de-interleaver and FEC decoder and configured to operate in response to CRC checking results.

The demodulator, the FEC decoder, the channel rate estimation device, the SNR estimation device, and the combiner device can all be implemented on an application specific integrated circuit (ASIC). Alternatively, any of these components can be implemented via software by DSP, CPU, or other programmable devices.

Preferred methods implement forward error detection decoding (FEC) of received wireless communication signals. Such methods include processing received modulated communication signals for a particular communication channel to produce demodulated signals. The received communication signals for the particular communication channel are also processed to produce channel rate change estimates. Signal to noise ratio (SNR) estimates are produced based on observation windows of a calculated number of samples of the received signal where the number of samples used for each observation window is calculated as a function of the produced channel rate change estimates. Adjusted demodulated signals are produced by combining the demodulated signals and the SNR estimates. The adjusted demodulated signals are forward error correction (FEC) decoded to produce decoded information bits.

In a preferred method, desired observation periods are computed based on the channel change rate estimates. The computed desired observation period controls the number of samples used for the observation windows upon which respective SNR estimates are based. Preferably, channel rate change estimates R are produced in accordance with the following equation:

$$R = \frac{1}{2\pi \Delta t} \underset{\substack{k \\ |h[k,t]| \neq 0 \\ |h[k,t+\Delta t]| \neq 0}}{\text{Max}} \arg\left(\frac{h[k,t]}{h[k,t-\Delta t]}\right)$$

where h[k,t] is the estimated channel impulse response at lag k, and time t. R can alternatively be computed by other means that are, e.g., less complex.

The method can be, for example, implemented by a wireless transmit receive unit (WTRU) configured for use in a Universal Mobile Telecommunications System (UMTS) as a user equipment (UE) or a base station. Where the method is implemented by a wireless transmit receive unit (WTRU) configured for use in a communication system where the channel data is interleaved prior to transmission, an inverse of the interleaving process is preferably performed on the adjusted demodulated signals to produce de-interleaved adjusted demodulated signals in advance of FEC decoding. Where the method is implemented by a wireless transmit receive unit (WTRU) configured for use in a communication system that employs Hybrid Automatic Repeat Requests (H-ARQ), cyclic redundancy code (CRC) checking of the output decoded information bits of the FEC decoder is preferably performed to produce CRC checking results and the CRC checking results are preferably used as an acknowledgement and for retransmission combining of the de-interleaved adjusted demodulated signals in advance of FEC decoding.

Other objects and advantages will be apparent to those of ordinary skill in the art based upon the following description of presently preferred embodiments of the invention.

DETAILED DESCRIPTION OF THE PREFERRED EMBODIMENT(S)

The present invention is described with reference to the drawing figures wherein like numerals represent like elements throughout. The terms base station, wireless transmit/receive unit (WTRU) and mobile unit are used in their general sense. The term base station as used herein includes, but is not limited to, a base station, Node-B, site controller, access point, or other interfacing device in a wireless environment that provides WTRUs with wireless access to a network with which the base station is associated.

The term WTRU as used herein includes, but is not limited to, user equipment (UE), mobile station, fixed or mobile subscriber unit, pager, or any other type of device capable of operating in a wireless environment. WTRUs include personal communication devices, such as phones, video phones, and Internet ready phones that have network connections. In addition, WTRUs include portable personal computing devices, such as PDAs and notebook computers with wireless modems that have similar network capabilities. WTRUs that are portable or can otherwise change location are referred to as mobile units.

The present invention is particularly useful when used in conjunction with mobile units, i.e., mobile WTRUs, as well as base station WTRUs that receive wireless communications from mobile units that are configured to utilize Forward Error Correction (FEC). For example, the invention can be implemented in either UEs or Node Bs of the conventional UTMS system illustrated in FIG. 1.

Figure 2:
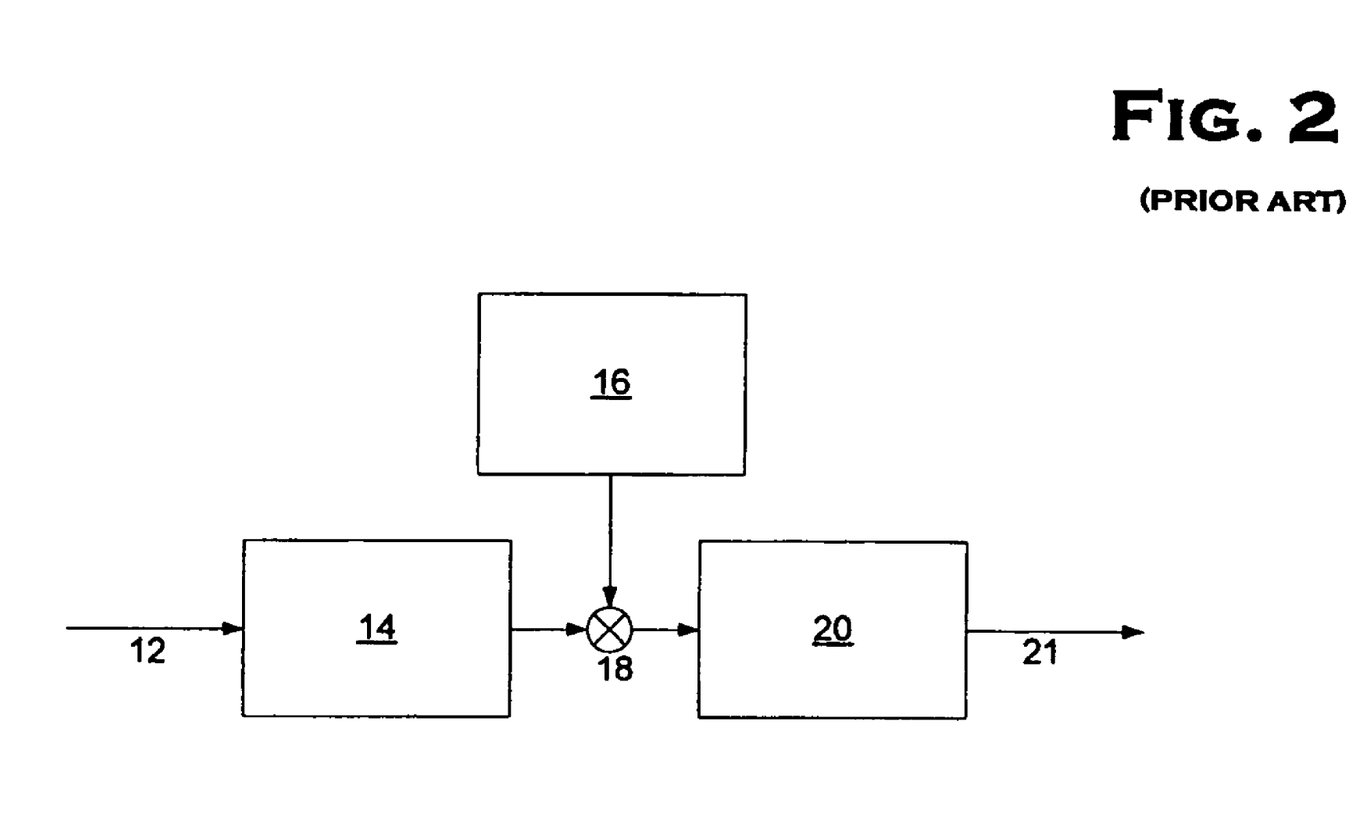
FIG. 2 is a block diagram of conventional components of a WTRU receiver.

Referring to FIG. 2, typical components of a WTRU or base station receiver that is configured to utilize FEC are illustrated. The conventional receiver includes an input 12 which carries a modulated communication signal for a particular communication channel which is processed by a demodulator 14. A SNR estimation device 16 produces an SNR estimate based on an observation window of a predetermined number of samples of the received signal in a conventional manner. Conventionally the estimate is updated for each successive window as the communication signal is processed, but may be updated at each sample or other rate.

The output of the demodulator 14 and the output of the SNR estimation device 16 are combined by a combiner device 18 to produce an adjusted demodulated signal suitable for FEC decoding by a FEC decoder 20 that has an output 21 that carries the decoded information bits. Where the channel communication signal has been interleaved before modulation, the adjusted demodulated signal is de-interleaved before FEC decoding. For systems that implement Hybrid Automatic Repeat Request (H-ARQ), where a channel communication signal has retransmission combining and cyclic redundancy code (CRC) check blocks, retransmission combining responsive to CRC checking may be performed on the signal before FEC decoding.

In many communication systems, the SNR estimation is accomplished with the assistance of a pilot (or training) signal. The structure of the pilot signal, in some cases, determines the natural observation duration for SNR estimation. If the system of interest employs a pilot signal, the nature of the pilot signal may determine a natural granularity for the observation interval (e.g. time slot, or frame).

A variety of other processes or combinations of such processes are known and dependent upon the parameters of the particular wireless system that is implementing FEC decoding. Common to all of the prior art configurations, is the production of SNR estimates based on observation window of a predetermined number of samples of the received signal, i.e. a fixed observation period. The estimated SNR value may change from one observation window to another and, accordingly, change the adjustment to the demodulated signal. However, for any given time interval corresponding to the observation window, the demodulated signal is processed with the SNR estimate for that window. This can be problematic if the estimates of SNR are degraded due to use of a relatively small window or with relatively large window more accurate the SNR estimates being applied to a signal that has varied substantially from the average SNR for most of a code block.

The present invention provides SNR estimation for scaling soft information that is a compromise between two competing phenomena, i.e. obtaining SNR estimates by using observation periods that are too short or too long. The invention results in better optimization of the scaling of soft information for FEC decoding. Improved decoded bit error probability, block error probability, and consequently, throughput performance can be achieved.

Figure 3:
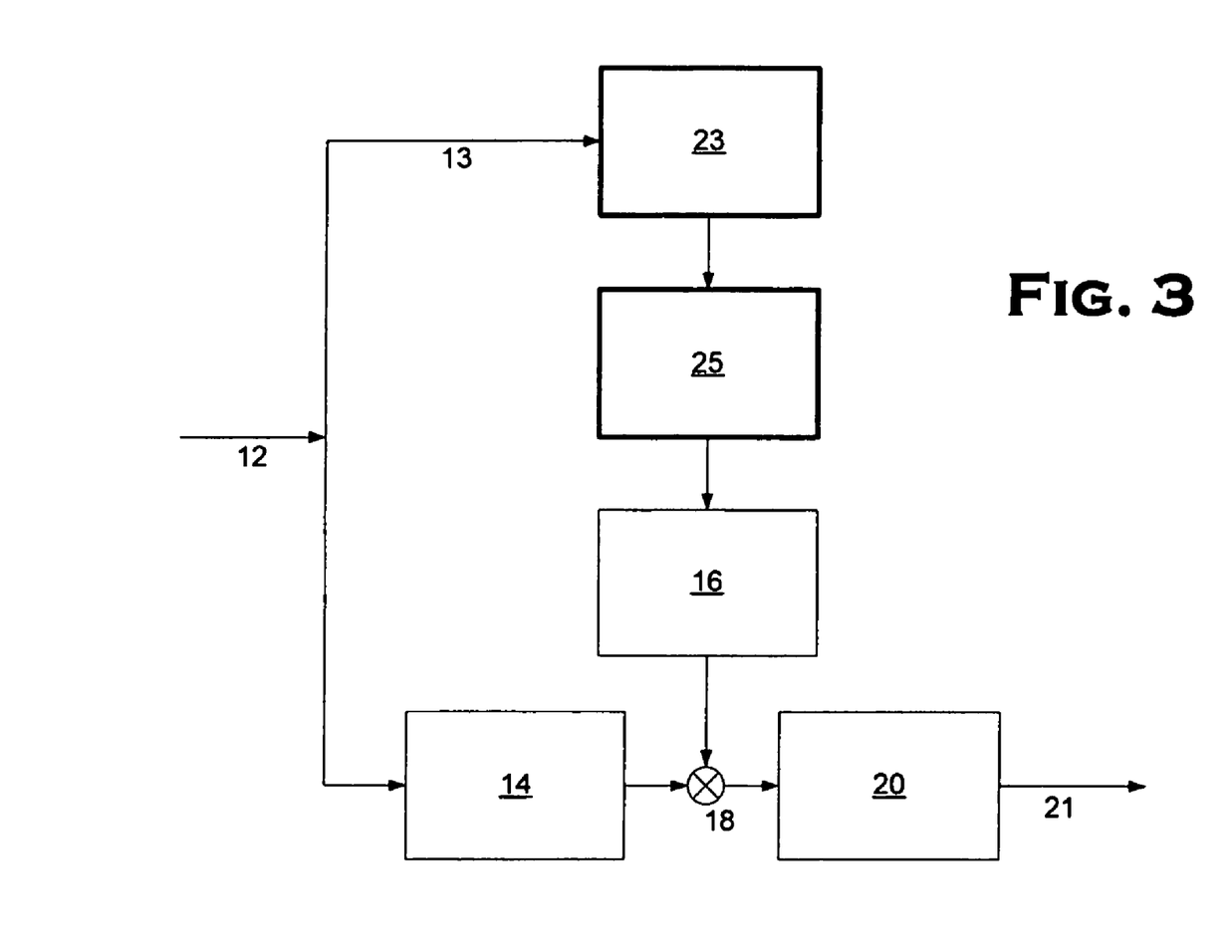
FIG. 3 is a block diagram of the conventional components of a WTRU receiver made in accordance with the teaching of the present invention.

With reference to FIG. 3, the prior art receiver components of FIG. 2 are shown with the addition of a channel rate estimation device 23 and an observation window selection device 25. Preferably the input 12 which carries a modulated communication signal to the demodulator also has a branch which forms an input for the channel rate estimation device 23. The channel rate estimation device 23 is configured to estimate the rate of change of the channel signals and output that rate information to the observation window selection device 25. The observation window selection device 25 then computes a desired observation period that is then passed to the SNR estimator device 16. It is known in the art that SNR estimator devices 16 can have the observation period and weighting parameters selected as a user defined parameter. However, the invention provides for the dynamic updating of these parameters during the processing of received channel communication signals.

The invention includes the estimation of the rate of change of the channel and the selection of a desired SNR observation interval that accordingly provides better optimization of overall FEC decoding. The channel rate estimate can be computed in a variety of ways which will be apparent to those of skill in the art. A preferred example is as follows:

$$R = \frac{1}{2\pi\Delta t} \underset{\substack{k \\ |h[k,t]| \neq 0 \\ |h[k,t+\Delta t]| \neq 0}}{\text{Max}} \arg\left(\frac{h[k,t]}{h[k, t - \Delta t]}\right)$$

where h[k,t] is the estimated channel impulse response at lag k, and time t.

R can alternatively be computed by other means that are, e.g., less complex. Additional factors may also be considered in the selection of the window size such as the SNR estimates themselves since actual SNR also impacts the quality of the SNR estimates. Furthermore, the window shape (i.e., weighting of the importance of different samples) may also be altered to provide performance improvements, e.g., an equally weighted moving average window may be replaced with and exponentially weighted moving average if indicated.

Based on this estimated channel change rate, an observation rate for SNR estimation that is based on R is selected. If the SNR estimation is pilot-assisted, it is preferred to adjust the SNR observation rate to match the structure of the pilot signal.

As will be recognized by those skilled in the art, there are a variety of methods to select the SNR estimation window size based on the estimate channel change rate, R. In a preferred embodiment, the SNR window size is selected to minimize the mean squared error between the estimated SNR and the instantaneous true SNR. Additional factors may also be considered in the selection of the window size such as the SNR estimates themselves since actual SNR also impacts the quality of the SNR estimates. Furthermore, the window shape (i.e., weighting of the importance of different samples) may also be altered to provide performance improvements, e.g., an equally weighted moving average window may be replaced with and exponentially weighted moving average if indicated.

As illustrated in FIG. 3, the steps of channel rate estimation and the selection of a more optimal observation interval are used to control the conventional SNR estimation, so that the improved SNR estimation output when combined with the conventional demodulation output enables improved processing through an FEC decoder to obtain information bits.

Figure 4:
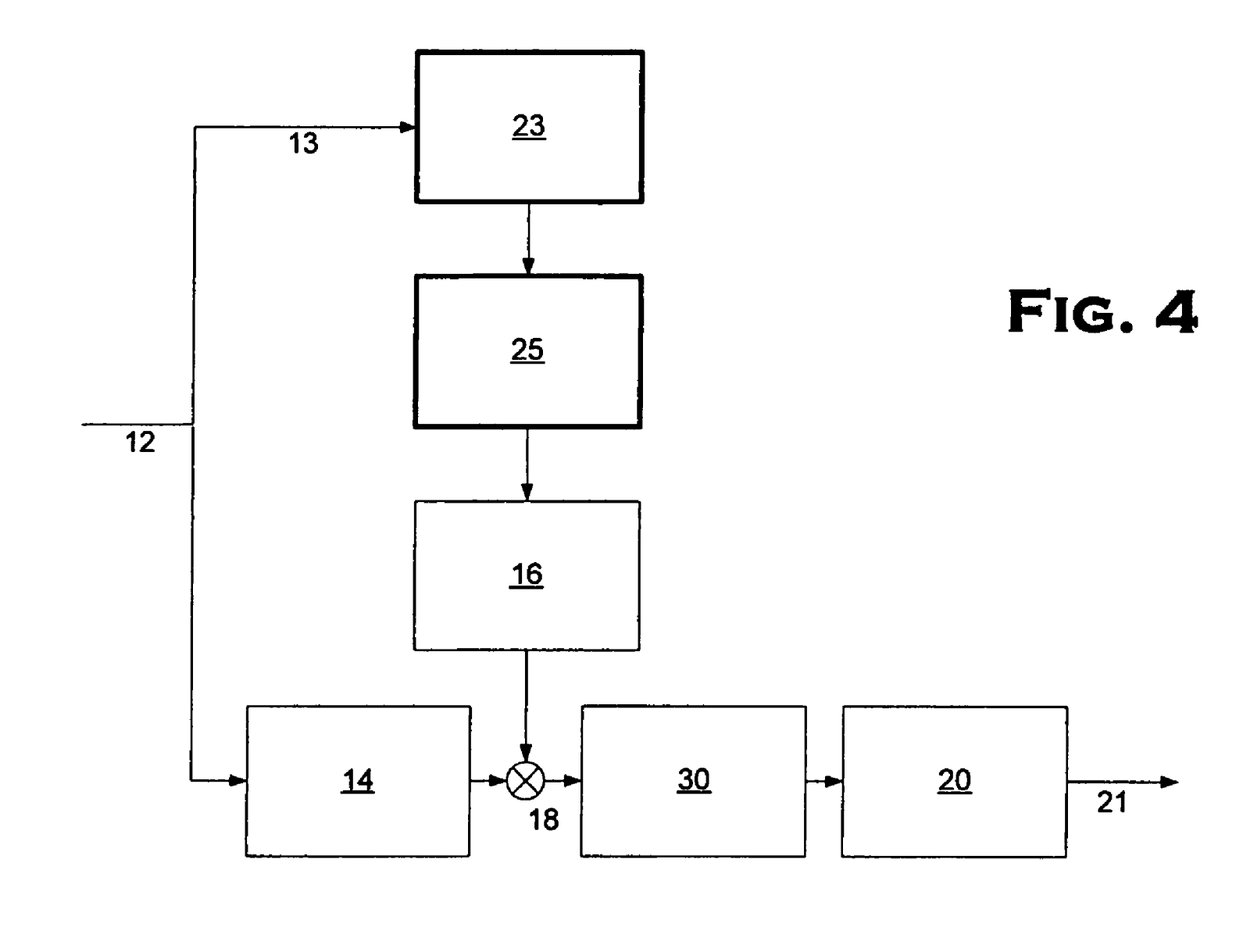
FIG. 4 is a block diagram of components of a WTRU receiver for a system with interleaving made in accordance with the teaching of the present invention.
Figure 5:
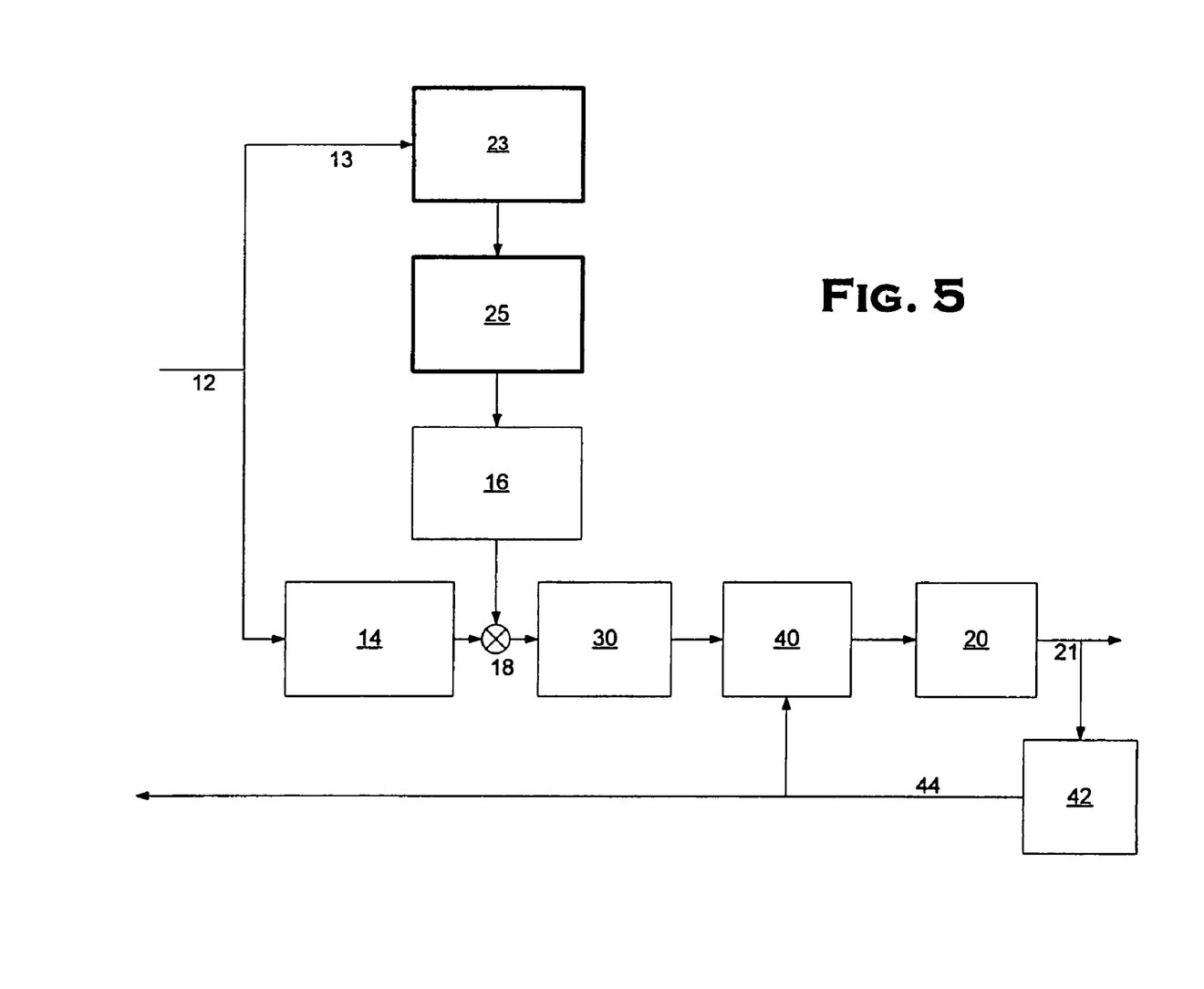
FIG. 5 is a block diagram of components of a WTRU receiver for a system with hybrid ARQ made in accordance with the teaching of the present invention.

FIGS. 4 and 5 illustrate that the invention is readily implemented where additional processes or combinations of such process are implemented in conjunction with FEC decoding. As shown in FIG. 4, the receiver component configuration of FIG. 3 can be supplemented by the addition of a de-interleaver device 30 which is used for communication systems where the channel data is interleaved prior to transmission. The de-interleaver 30 is preferably situated after the scaling for combining 18 and in advance of the decoding device 20. The de-interleaver 30 preferably performs the inverse of the interleaving process preformed in the transmitter.

As shown in FIG. 5, the receiver component configuration of FIG. 4 can be further supplemented by the addition of a retransmission combining device 40 and a CRC checking device 42 to accommodate systems that employ Hybrid Automatic Repeat Request (H-ARQ). Combining of multiple transmissions at the receiver is improved relative to a scale factor that is constant across each re-transmission. The CRC device 42 is preferably configured in a conventional manner to receive the output 21 of the FEC decoder 20 and conduct a cyclic redundancy check. The results of that checking are output through a line 44 which preferably conveys the checking results as an acknowledgement or negative acknowledgment, depending upon the checking results, in a conventional manner. The CRC device output 44 is preferably configured to also serve as the input for the retransmission combining device 40 which operates in the conventional manner for H-ARQ systems. Preferably, the retransmission combining device 40 is situated between the de-interleaver 30 and FEC decoder 20 as illustrated in FIG. 5.

Preferably, the components of FIGS. 3–5 are implemented on a single integrated circuit, such as an application specific integrated circuit (ASIC). However, the components may also be readily implemented on multiple separate integrated circuits or in software on general purpose CPUs/DSPs.

Filtering of the channel change rate can be used to reduce the likelihood of erroneous setting of the SNR observation rate. Also, the adaptive nature of the invention performed by the selection device 25 can be omitted and the channel estimation device 16 can be configured to use channel rate information that is directly received from the channel rate estimation device 23 as a control parameter. The scaling of the soft information is then performed at a rate that is commensurate with the rate of change of the channel with respect to time.

Other variations and modifications consistent with the invention will be recognized by those of ordinary skill in the art.

What is claimed is:

1. A wireless transmit receive unit (WTRU) comprising a receiver configured to implement forward error detection decoding (FEC) of received communication signals that includes:
    a demodulator configured to process received modulated communication signals for a particular communication channel and to produce demodulated signals;
    an observation window selection device configured to dynamically calculate window sizes defining a number of received samples for observation in a window based on characteristics of the received communication signals for the particular communication channel;

a signal to noise ratio (SNR) estimation device configured to produce SNR estimates based the number of received samples in an observation window of a size calculated by the observation window selection device;

a combiner device configured to produce adjusted demodulated signals based on the demodulated signals produced by the demodulator and the SNR estimates produced by the SNR estimation device; and an FEC decoder configured for decoding the adjusted demodulated signals and outputting decoded information bits.

2. The WTRU of claim 1 wherein the observation window selection device is configured to compute window sizes based on channel change rate estimates produced by a channel rate estimation device and to output the computed window sizes to the SNR estimator device to control the number of samples used for the observation windows upon which the respective SNR estimates are based.

3. The WTRU of claim 2 wherein the channel rate estimation device is configured to produce channel change rate estimates R as follows:

$$R = \frac{1}{2\pi\Delta t} \underset{\substack{k \\ |h[k,t]| \neq 0 \\ |h[k,t+\Delta t]| \neq 0}}{\text{Max}} \arg\left(\frac{h[k,t]}{h[k,t-\Delta t]}\right)$$

where h[k,t] is the estimated channel impulse response at lag k, and time t.

4. The WTRU of claim 2 wherein the demodulator, the observation window selection device, the channel rate estimation device, the SNR estimation device, the combiner device and the FEC decoder are implemented on an application specific integrated circuit (ASIC).

5. The WTRU of claim 4 wherein the channel rate estimation device is configured to produce channel change rate estimates R as follows:

$$R = \frac{1}{2\pi\Delta t} \underset{\substack{k \\ |h[k,t]| \neq 0 \\ |h[k,t+\Delta t]| \neq 0}}{\text{Max}} \arg\left(\frac{h[k,t]}{h[k,t-\Delta t]}\right)$$

where h[k,t] is the estimated channel impulse response at lag k, and time t.

6. The WTRU of claim 1 wherein the WTRU is configured for use in a Universal Mobile Telecommunications System (UMTS) as a user equipment (UE) or a base station.

7. The WTRU of claim 1 wherein the WTRU is configured for use in a communication system where the channel data is interleaved prior to transmission, further comprising a de-interleaver situated after the combiner device and in advance of the FEC decoder configured to perform an inverse of the interleaving process performed prior to transmission.

8. The WTRU of claim 7 wherein the WTRU is configured for use in a communication system that employs Hybrid Automatic Repeat Requests (H-ARQ), further comprising a retransmission combining device and a cyclic redundancy code (CRC) checking device, the CRC device configured to receive the output decoded information bits of the FEC decoder, conduct a cyclic redundancy check and to output the CRC checking results for use as an acknowledgement and for use by the retransmission combining device, and the retransmission combining device situated between the de-interleaver and FEC decoder and configured to operates in response to CRC checking results.

9. The WTRU of claim 1 wherein the demodulator, the channel rate estimation device, the SNR estimation device, and the combiner device are implemented on an application specific integrated circuit (ASIC).

10. The WTRU of claim 1 wherein the demodulator, the observation window selection device, the SNR estimation device, the combiner device and the FEC decoder are implemented on an application specific integrated circuit (ASIC).

11. A method for implementing forward error detection decoding (FEC) of received wireless communication signals comprising:

processing received modulated communication signals for a particular communication channel to produce demodulated signals;

calculating window sizes defining a number of received samples for observation in a window based on characteristics of the received communication signals for the particular communication channel;

producing signal to noise ratio (SNR) estimates based the number of received samples in an observation window of a calculated size;

producing adjusted demodulated signals by combining the demodulated signals and the SNR estimates; and forward error correction (FEC) decoding the adjusted demodulated signals to produce decoded information bits.

12. The method of claim 11 wherein the calculating of window sizes is based on channel change rate estimates and the calculated window sizes are used to control the number of samples used for the observation windows upon which respective SNR estimates are based.

13. The method of claim 12 wherein channel change rate estimates R are produced in accordance with the following equation:

$$R = \frac{1}{2\pi\Delta t} \underset{\substack{|h[k,t]| \neq 0 \\ |h[k,t+\Delta t]| \neq 0}}{\text{Max}} \arg\left(\frac{h[k,t]}{h[k,t-\Delta t]}\right)$$

where h[k,t] is the estimated channel impulse response at lag k, and time t.

14. The method of claim 12 wherein the demodulating, the channel rate estimation, the SNR estimation and the combining of the demodulated signals and the SNR estimates are implemented in an application specific integrated circuit (ASIC).

15. The method of claim 12 wherein the demodulating, the channel rate estimation, the SNR estimation, the combining of the demodulated signals and the SNR estimates and the FEC decoding are implemented on an application specific integrated circuit (ASIC).

16. The method of claim 15 wherein channel change rate estimates R are produced in accordance with the following equation:

$$R = \frac{1}{2\pi\Delta t} \underset{\substack{k \\ |h[k,t]| \neq 0 \\ |h[k,t+\Delta t]| \neq 0}}{\text{Max}} \arg\left(\frac{h[k,t]}{h[k,t-\Delta t]}\right)$$

where h[k,t] is the estimated channel impulse response at lag k, and time t.

17. The method of claim 11 wherein the method is implemented by a wireless transmit receive unit (WTRU)

configured for use in a Universal Mobile Telecommunications System (UMTS) as a user equipment (UE) or a base station.

18. The method of claim 11 wherein the method is implemented by a wireless transmit receive unit (WTRU) configured for use in a communication system where the channel data is interleaved prior to transmission, further comprising performing an inverse of the interleaving process on the adjusted demodulated signals to produce de-interleaved adjusted demodulated signals in advance of FEC decoding.

19. The method of claim 18 wherein the method is implemented by a wireless transmit receive unit (WTRU) configured for use in a communication system that employs Hybrid Automatic Repeat Requests (H-ARQ), further comprising cyclic redundancy code (CRC) checking of the output decoded information bits of the FEC decoder to produce CRC checking results and using the CRC checking results as an acknowledgement and for retransmission combining of the de-interleaved adjusted demodulated signals in advance of FEC decoding.

20. The method of claim 11 wherein the demodulating, the calculating window sizes, the producing SNR estimates, the combining of the demodulated signals and the SNR estimates and the FEC decoding are implemented on an application specific integrated circuit (ASIC).

* * * * *

UNITED STATES PATENT AND TRADEMARK OFFICE
CERTIFICATE OF CORRECTION

| | |
|---|---|
| PATENT NO. | : 7,032,160 B2 |
| APPLICATION NO. | : 10/912671 |
| DATED | : April 18, 2006 |
| INVENTOR(S) | : Sternberg et al. |

It is certified that error appears in the above-identified patent and that said Letters Patent is hereby corrected as shown below:

ABSTRACT

TITLE PAGE, ITEM (57), line 13, after the word "calculate", insert "as".

TITLE PAGE, ITEM (57), after the word "estimates", delete "produce" and insert therefor --produced--.

At column 1, line 11, after "2003", insert --,--.

At column 2, line 40, after the word "also", delete "provides" and insert therefor --provide--.

At column 2, line 46, after the word "Typically", delete "a" and insert therefor --an--.

At column 2, line 58, after the words "passed to", delete "a" and insert therefor --an--.

At column 6, line 22, after "14", delete "A" and insert therefor --An--.

UNITED STATES PATENT AND TRADEMARK OFFICE
CERTIFICATE OF CORRECTION

PATENT NO.      : 7,032,160 B2
APPLICATION NO. : 10/912671
DATED           : April 18, 2006
INVENTOR(S)     : Sternberg et al.

It is certified that error appears in the above-identified patent and that said Letters Patent is hereby corrected as shown below:

At column 6, line 22, after "14", delete "A" and insert therefor --An--.

At column 6, line 53, after the word "on", insert --an--.

At column 6, line 63, after the word "accurate", delete "the".

At column 7, line 46, after the word "with", delete "and" and insert therefor --any--.

IN THE CLAIMS

At claim 1, column 9, line 5, after the word "based", insert --on--.

At claim 11, column 10, line 22, after the word "based", insert --on--.

Signed and Sealed this

Twelfth Day of December, 2006

JON W. DUDAS
*Director of the United States Patent and Trademark Office*